(12) United States Patent
Lee et al.

(10) Patent No.: US 10,177,750 B2
(45) Date of Patent: Jan. 8, 2019

(54) AVERAGING CIRCUIT WHICH DETERMINES AVERAGE VOLTAGE OF N SAMPLES, USING $LOG_2N$-SCALE CAPACITORS

(71) Applicant: Kabushiki Kaisha Toshiba, Minato-ku (JP)

(72) Inventors: Sungjun Lee, Tokyo (JP); Makoto Takamiya, Tokyo (JP); Takayasu Sakurai, Tokyo (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 15 days.

(21) Appl. No.: 15/262,405

(22) Filed: Sep. 12, 2016

(65) Prior Publication Data

US 2017/0230035 A1 Aug. 10, 2017

(30) Foreign Application Priority Data

Feb. 5, 2016 (JP) .................................. 2016-020691

(51) Int. Cl.
| | |
|---|---|
| *H04N 5/341* | (2011.01) |
| *H04N 5/345* | (2011.01) |
| *H03K 9/00* | (2006.01) |
| *G01R 15/16* | (2006.01) |

(Continued)

(52) U.S. Cl.
CPC ......... *H03K 5/1252* (2013.01); *G01R 19/003* (2013.01); *H03H 19/004* (2013.01); *H04B 1/10* (2013.01)

(58) Field of Classification Search
CPC .. H03K 5/1252; G01R 19/003; H03H 19/004; H04B 1/10; H03F 2200/135; H04N 2101/00

(Continued)

(56) References Cited

U.S. PATENT DOCUMENTS 6,084,465 A * 7/2000 Dasgupta ............ H03F 3/45188
327/552
9,584,226 B2 * 2/2017 Polster .................... H03F 3/082
(Continued)

FOREIGN PATENT DOCUMENTS

| JP | 58-50817 A | 3/1983 |
|---|---|---|
| JP | 2009-65405 A | 3/2009 |

OTHER PUBLICATIONS

Danielle Griffith, et al., "A 65nm CMOS DCXO System for Generating 38.4MHz and a Real Time Clock from a Single Cyrstal in 0.09mm2", IEEE Radio Frequency Integrated Circuits Symposium, 2010, 4 pgs.

(Continued)

*Primary Examiner* — Brandon S Cole
(74) *Attorney, Agent, or Firm* — Oblon, McClelland, Maier & Neustadt, L.L.P.

(57) ABSTRACT

For example, an averaging circuit includes first to third capacitors and a controller. The controller causes a first first-stage average voltage to be applied to a first capacitor, the first first-stage average voltage being an average of a first voltage applied to the first capacitor and a second voltage applied to a second capacitor, causes a second first-stage average voltage to be applied to the second capacitor, the second first-stage average voltage being an average of a third voltage applied to the second capacitor and a fourth voltage applied to a third capacitor, and causes a first second-stage average voltage to be applied to the first capacitor, the first second-stage average voltage being an average of the first and second first-stage average voltages applied to the first and second capacitors.

3 Claims, 14 Drawing Sheets

(51) Int. Cl.
*H03K 17/96* (2006.01)
*H03K 5/1252* (2006.01)
*H04B 1/10* (2006.01)
*G01R 19/00* (2006.01)
*H03H 19/00* (2006.01)

(58) Field of Classification Search
USPC .......................................... 327/365–508; 1/1
See application file for complete search history.

(56) References Cited

U.S. PATENT DOCUMENTS

| | | |
|---|---|---|
| 9,590,649 B2 * | 3/2017 | Bartling ............. H03K 17/9622 |
| 9,857,395 B2 * | 1/2018 | Wang ..................... G01R 15/18 |
| 2009/0068976 A1 | 3/2009 | Sano et al. |
| 2009/0322418 A1 | 12/2009 | Burke |
| 2010/0066581 A1 * | 3/2010 | Ito ........................ G11C 27/026 |
| | | 341/158 |
| 2015/0229832 A1 * | 8/2015 | Itano .................... H04N 5/3458 |
| | | 348/295 |
| 2016/0149648 A1 * | 5/2016 | Polster ................... H03F 3/082 |
| | | 398/160 |

OTHER PUBLICATIONS

Robert Bogdan Staszewski, et al., "All-Digital TX Frequency Synthesizer and Discrete-Time Receiver for Bluetooth Radio in 130-nm CMOS", IEEE Journal of Solid-State Circuits, vol. 39, (12), 2004, 14 pgs.

* cited by examiner

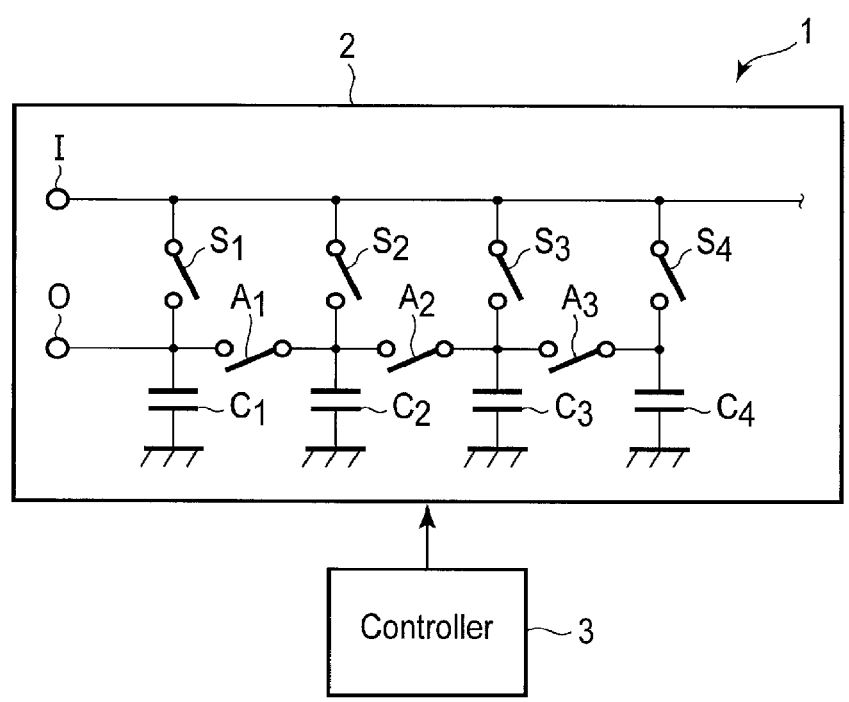
F I G. 1

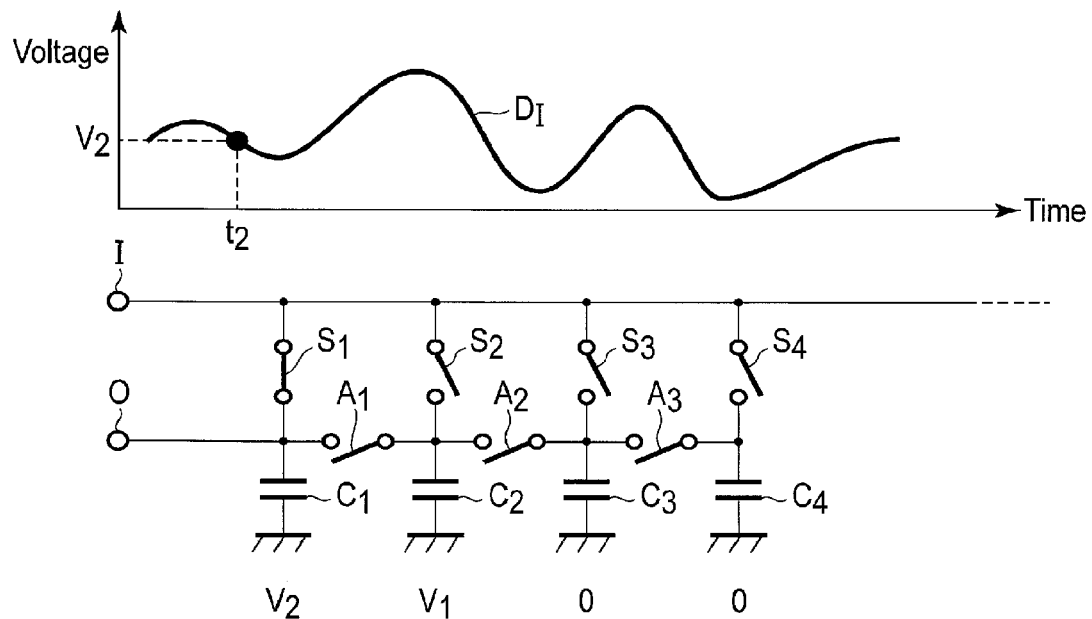
F I G. 4
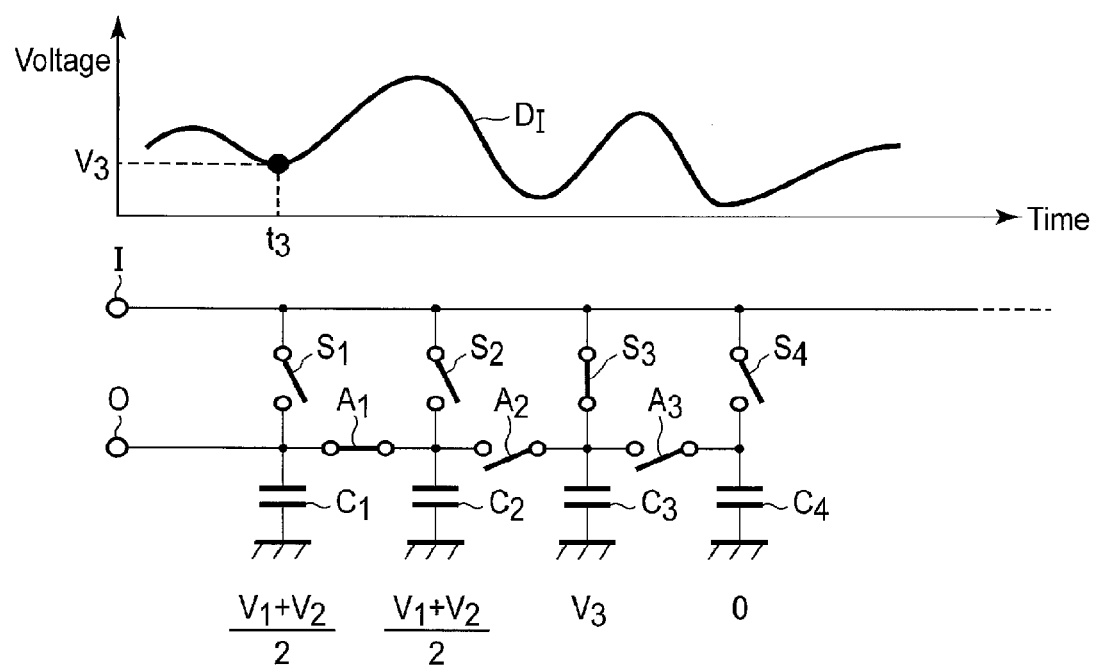
F I G. 5

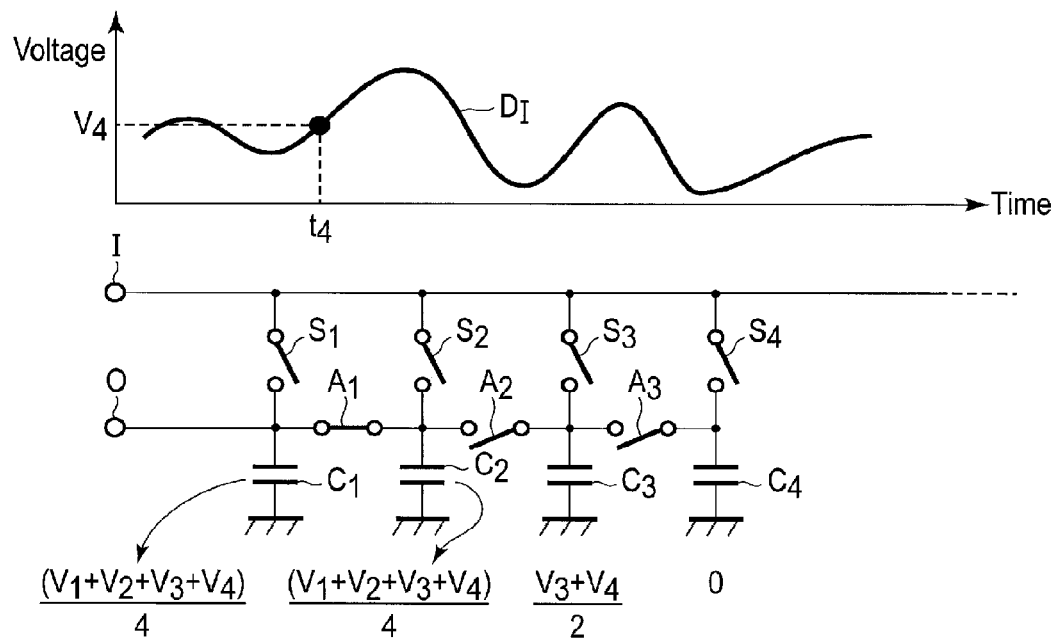
F I G. 8
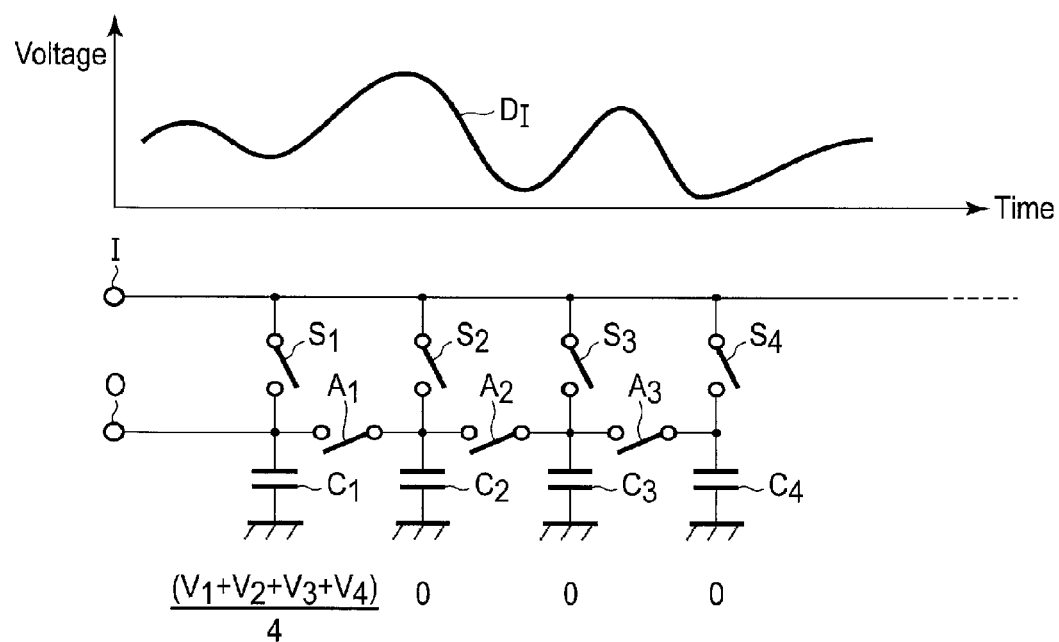
F I G. 9

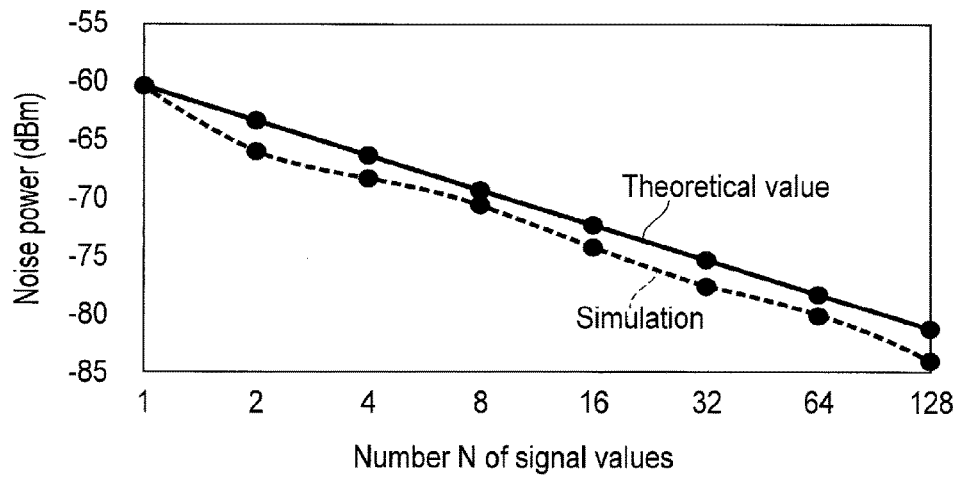
F I G. 14
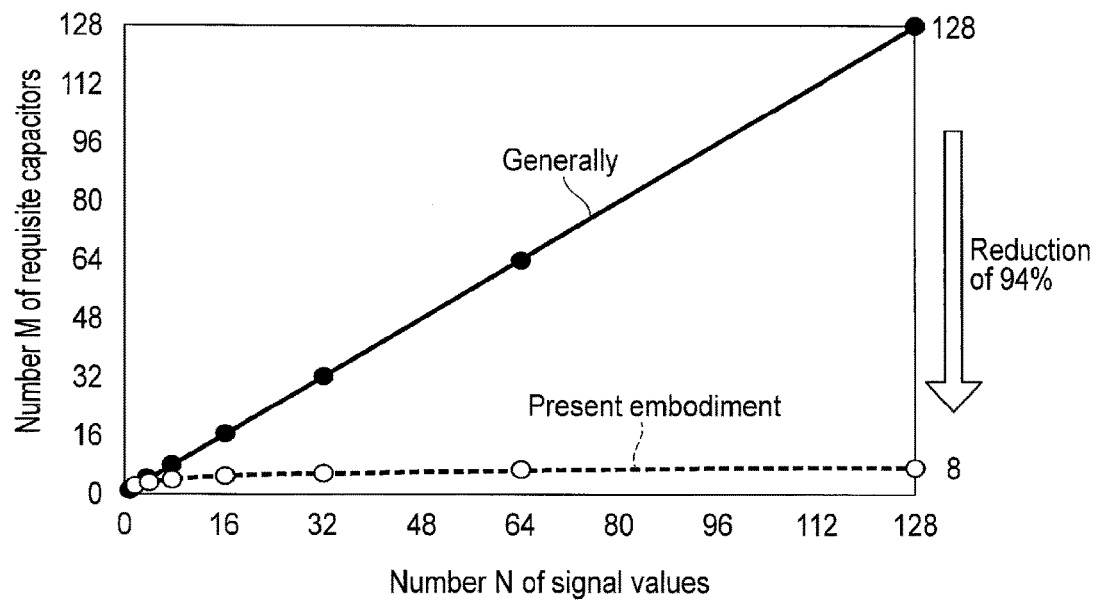
F I G. 15

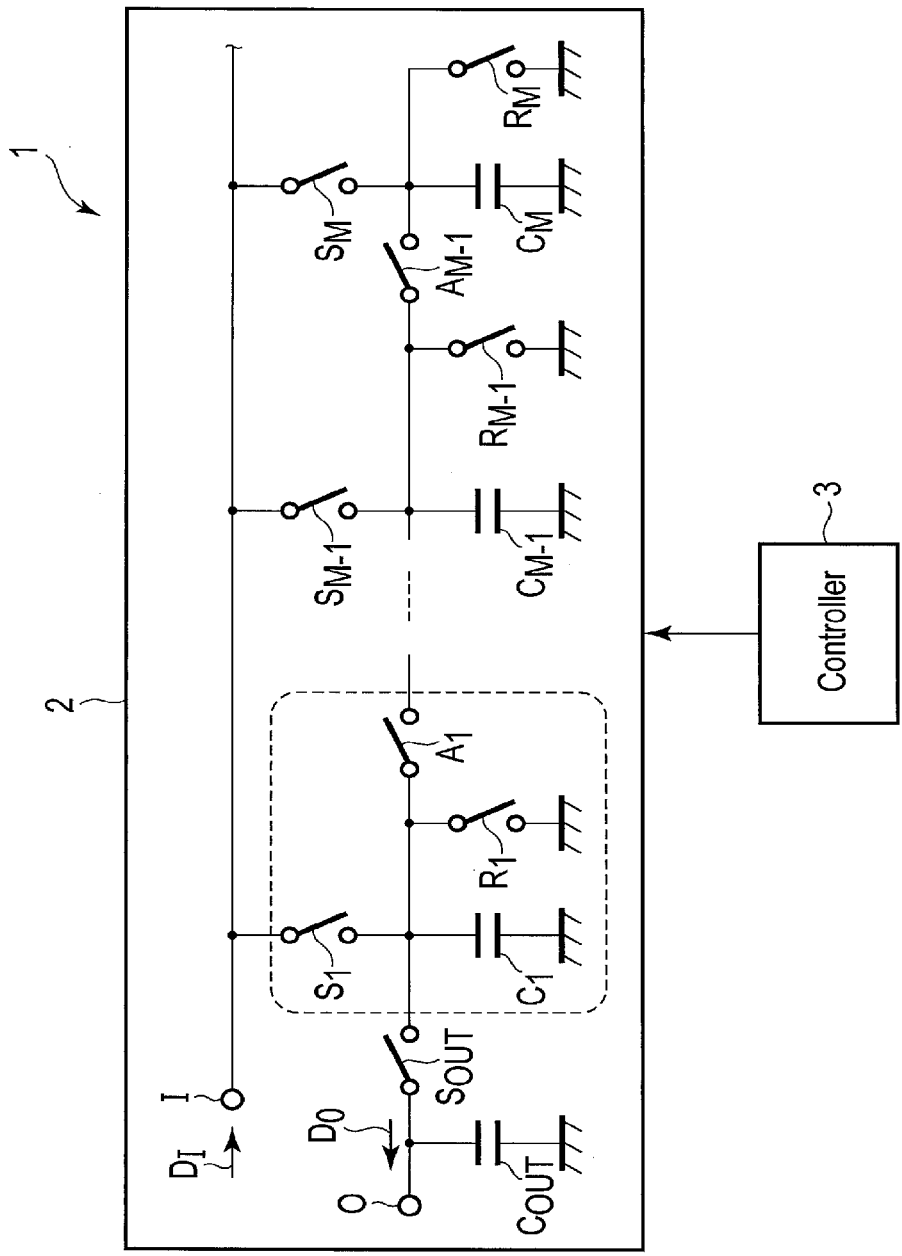
F I G. 16

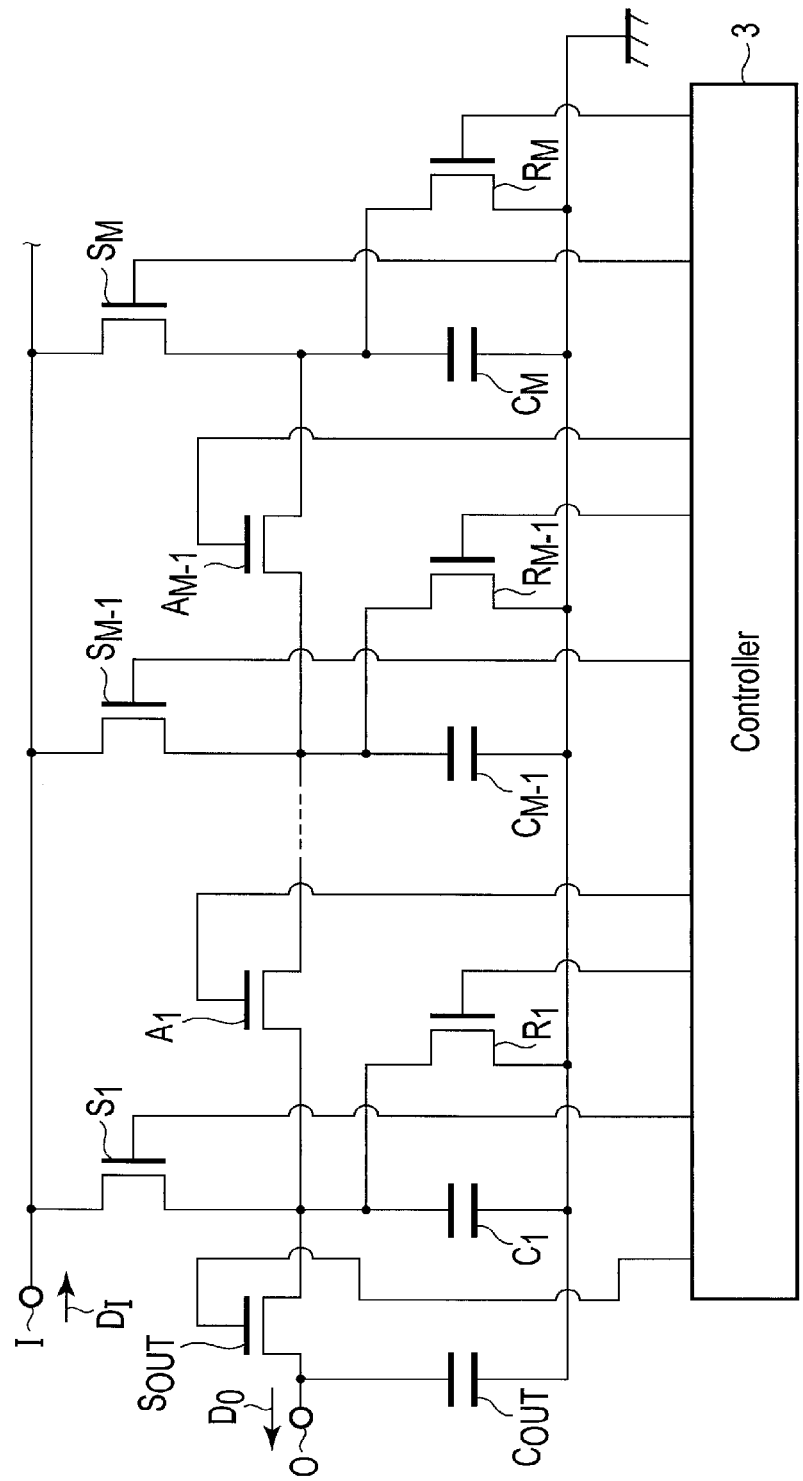
F I G. 17

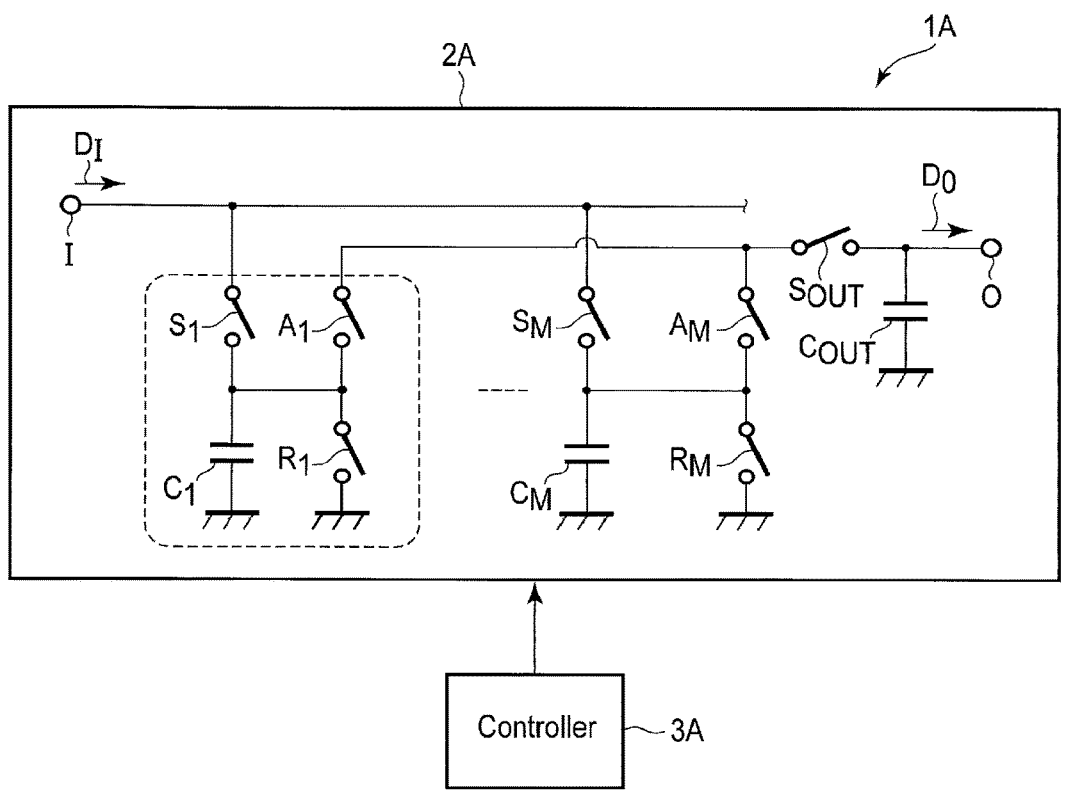
F I G. 19

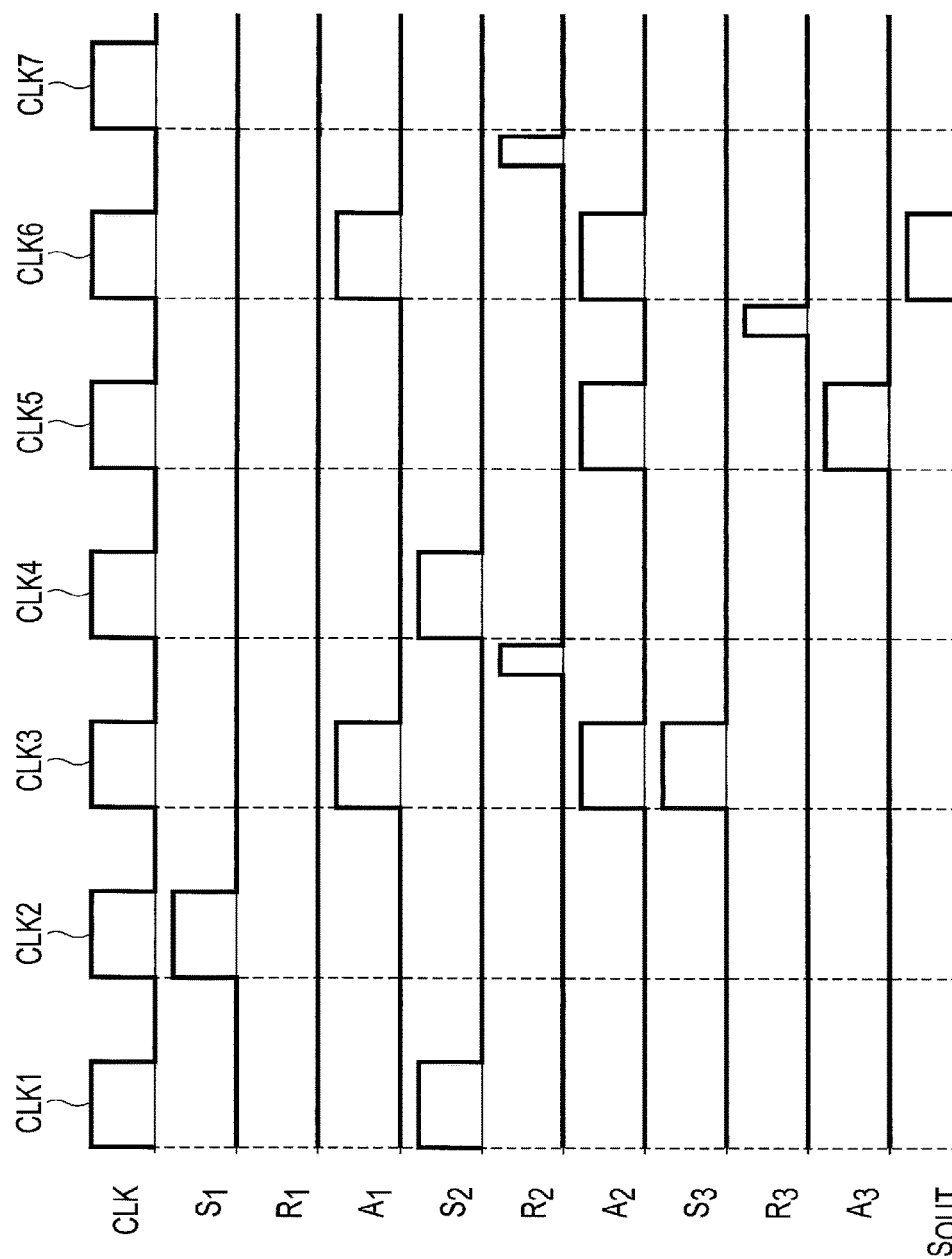
F I G. 21

AVERAGING CIRCUIT WHICH DETERMINES AVERAGE VOLTAGE OF N SAMPLES, USING LOG₂N-SCALE CAPACITORS

CROSS-REFERENCE TO RELATED APPLICATIONS

This application is based upon and claims the benefit of priority from Japanese Patent Application No. 2016-020691, filed Feb. 5, 2016, the entire contents of which are incorporated herein by reference.

FIELD

Embodiments described herein relate generally to an averaging circuit which determines average voltage of N samples, using $\log_2$ N-scale capacitors.

BACKGROUND

A discrete-time wireless receiver including a switched capacitor circuit has a high configurability. The discrete-time wireless receiver needs to eliminate noise. In a high-frequency domain applied to radio, noise is primarily thermal noise. The amplitude of noise approximates to a normal distribution.

In the case where the amplitude of noise contained in a signal approximates to a normal distribution, a number of signal values (samples) of the signal are sampled to determine an average value, so that the noise (noise power) contained in the signal can be reduced.

As an averaging circuit which determines an average value of N (a natural number of 2 or more) signal values, an averaging circuit employing N sampling switches and N capacitors is known.

BRIEF DESCRIPTION OF THE DRAWINGS

FIG. 1 is a circuit diagram showing an example of an averaging circuit according to the first embodiment.

FIG. 4 is a circuit diagram showing an example of the third stage of the operation performed by the averaging circuit according to the first embodiment.

FIG. 5 is a circuit diagram showing an example of the fourth stage of the operation performed by the averaging circuit according to the first embodiment.

FIG. 8 is a circuit diagram showing an example of the seventh stage of the operation performed by the averaging circuit according to the first embodiment.

FIG. 9 is a circuit diagram showing an example of the eighth stage of the operation performed by the averaging circuit according to the first embodiment.

FIG. 14 is a graph showing an example of a relationship between noise power and the number N of signal values to be equalized in the averaging circuit according to the first embodiment.

FIG. 15 is a graph showing an example of a reduction result of a circuit area in the averaging circuit according to the first embodiment.

FIG. 16 is a circuit diagram showing an example of a schematic configuration of an averaging circuit according to the second embodiment.

FIG. 17 is a circuit diagram showing an example of a detailed configuration of the averaging circuit according to the second embodiment.

FIG. 19 is a circuit diagram showing an example of a schematic configuration of an averaging circuit according to the third embodiment.

FIG. 21 is a timing chart showing an example of an operation of the averaging circuit according to the third embodiment.

DETAILED DESCRIPTION

Figure 2:
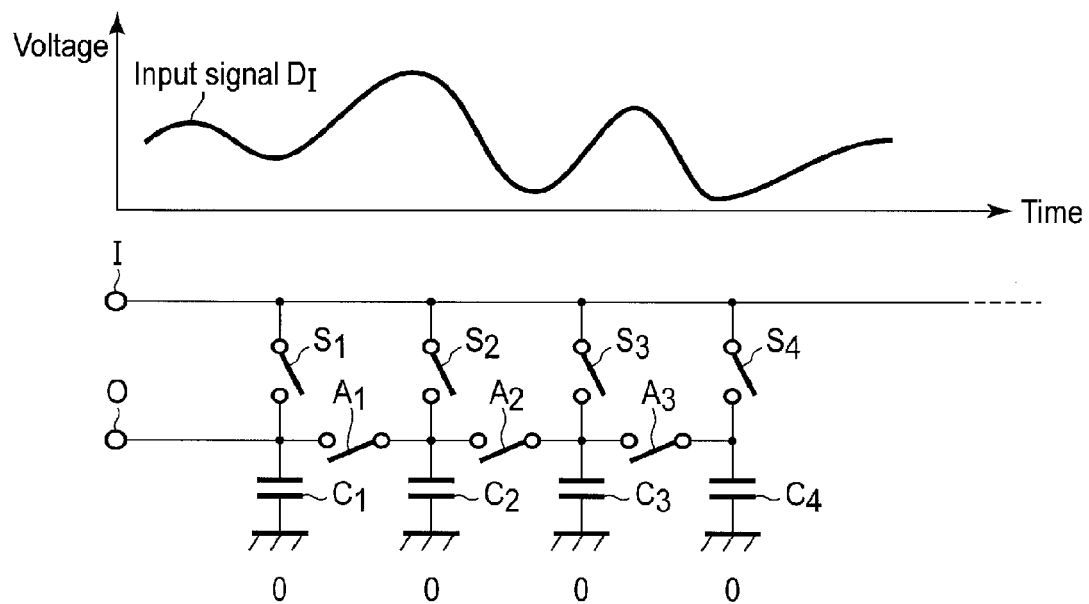
FIG. 2 is a circuit diagram showing an example of the first stage of an operation performed by the averaging circuit according to the first embodiment.

In general, according to one embodiment, an averaging circuit includes a capacitor circuit and a controller which controls the capacitor circuit. The capacitor circuit includes a plurality of circuit units and a plurality of averaging switches. The circuit units includes capacitors and sampling switches. The capacitor and sampling switch included in each of the circuit units are connected in series to each other. The averaging switches switch two capacitors connected in serious among the capacitors included in the circuit units. The controller controls the sampling switches included in the circuit units and the averaging switches. The controller causes a first first-stage average voltage to be applied to a first capacitor included in the circuit units. The first first-stage average voltage is an average of a first sample voltage applied to the first capacitor and a second sample voltage applied to a second capacitor included in the circuit units. The controller causes a second first-stage average voltage to be applied to the second capacitor. The second first-stage average voltage is an average of a third sample voltage applied to the second capacitor and a fourth sample voltage applied to a third capacitor included in the circuit units. The controller causes a first second-stage average voltage to be applied to the first capacitor. The first second-stage average voltage is an average of the first and second first-stage average voltages applied to the first and second capacitors.

Embodiments will be described hereinafter with reference to the accompanying drawings. In the drawings, identical elements will be denoted by the same reference numbers, respectively.

First Embodiment

In the first embodiment, for example, a discrete-time wireless receiver includes a reception module which receives a given input signal N times at intervals, a noise elimination module which determines an average value of N signal values of the signal received by the reception module, to thereby eliminate noise from the signal, and a signal processor which performs analog/digital conversion based on the value of the signal from which the noise have been eliminated.

In the following explanation of the first embodiment, an averaging circuit included in a noise elimination module in a wireless transceiver is described by way of example; however, a device including the averaging circuit is not limited to this.

With respect to the first embodiment, an averaging circuit which determines an average value of N signal values (N is the number of samples) using $(\log_2 N)+1$ capacitors will be referred to. With respect to the first embodiment, identical structural elements will be denoted by the same reference numeral, and after they are explained once, their explanations will be omitted or simply explained.

FIG. 1 is a circuit diagram showing an example of an averaging circuit according to the first embodiment.

In an example illustrated in FIG. 1, N is 8; and FIG. 1 illustrates an averaging circuit which determines an average value of eight signal values using four capacitors. However, N can be changed as long as the formula $N=A \times 2^P$ (A is 1, 2 or 3, and P is a natural number) is satisfied.

The averaging circuit 1 includes a switched capacitor circuit 2 and a controller 3.

The switched capacitor circuit 2 includes four sampling switches $S_1$ to $S_4$, four capacitors $C_1$ to $C_4$ and three averaging switches $A_1$ to $A_3$. In the first embodiment, a sampling switch and a capacitor which are connected in series to each other may be handled as a single circuit unit.

The averaging circuit 1 includes four sampling switches $S_1$ to $S_4$, four capacitors $C_1$ to $C_4$ and three averaging switches $A_1$ to $A_3$.

One end of sampling switch $S_1$ is connected to input terminal I, and the other end of sampling switch $S_1$ is connected to one end of capacitor $C_1$. The other end of capacitor $C_1$ is grounded.

The same is true of sampling switches $S_2$ to $S_4$ and capacitors $C_2$ to $C_4$; that is, sampling switches $S_2$ to $S_4$ and capacitors $C_2$ to $C_4$ are set in the same manner as sampling switch $S_1$ and capacitor $C_1$.

Ends of averaging switches $A_1$ to $A_3$ are respectively connected to ends of sampling switches $S_1$ to $S_3$ and ends of capacitors $C_1$ to $C_3$. The other ends of averaging switches $A_1$ to $A_3$ are respectively connected to the above ends of sampling switches $S_2$ to $S_4$ and the above ends of capacitors $C_2$ to $C_4$.

The capacitances of capacitors $C_1$ to $C_4$ are equal to each other.

Output terminal O is connected to one end of one of capacitors $C_1$ and $C_2$. In the example illustrated in FIG. 1, output terminal O is connected to one end of capacitor $C_1$.

The controller 3, as described later, produces control signals for effecting switching between ON and OFF states (closing and opening) of each of sampling switches $S_1$ to $S_4$ and switching between ON and OFF states (closing and opening) of each of averaging switches $A_1$ to $A_3$.

With reference to FIGS. 2 to 12, it will be explained how the averaging circuit 1 is operated to determine an average value. FIGS. 2 to 12 illustrate the states of the switches at respective stages, omitting the controller 3 for simplicity.

FIG. 2 is a circuit diagram showing an example of the first stage of an operation performed by the averaging circuit 1 according to the first embodiment.

The averaging circuit 1 determines an average value of signal values of input signal $D_I$ input from input terminal I. The voltage of input signal $D_I$ varies with the passage of time.

At the first stage, the controller 3 opens (turns off) sampling switches $S_1$ to $S_4$ and averaging switches $A_1$ to $A_3$. At this time, the voltages applied to capacitors $C_1$ to $C_4$ are zero.

Figure 3:
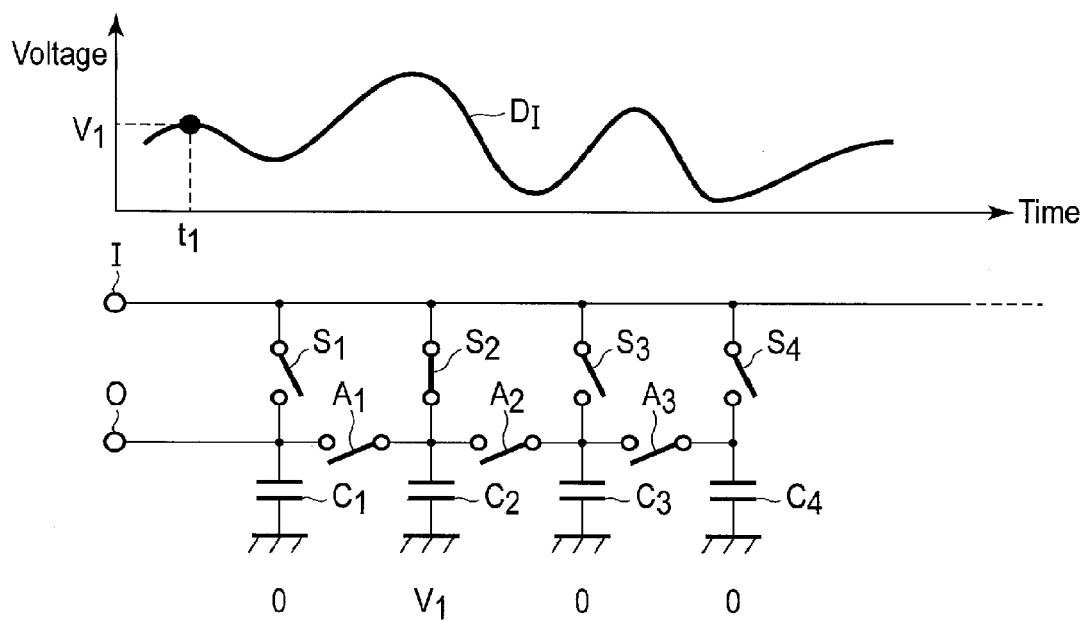
FIG. 3 is a circuit diagram showing an example of the second stage of the operation performed by the averaging circuit according to the first embodiment.

FIG. 3 is a circuit diagram showing an example of the second stage of the operation performed by the averaging circuit 1 according to the first embodiment.

At the second stage, the controller 3 closes (turns on) sampling switch $S_2$. Thereby, voltage $V_1$ of input signal $D_I$ at time $t_1$ is applied to capacitor $C_2$ connected in series to sampling switch $S_2$. The voltage obtained based on input signal $D_I$ will be referred to as the sampling voltage.

FIG. 4 is a circuit diagram showing an example of the third stage of the operation performed by the averaging circuit 1 according to the first embodiment.

At the third stage, the controller 3 opens sampling switch $S_2$, and then closes sampling switch $S_1$. Thereby, voltage $V_2$ of input signal $D_I$ at time $t_2$ is applied to capacitor $C_1$ connected in series to sampling switch $S_1$.

FIG. 5 is a circuit diagram showing an example of the fourth stage of the operation performed by the averaging circuit 1 according to the first embodiment.

At the fourth stage, the controller 3 opens sampling switch $S_1$, and then closes sampling switch $S_3$ and averaging switch $A_1$. Thereby, voltage $V_3$ of input signal $D_I$ at time $t_3$ is applied to capacitor $C_3$ connected in series to sampling switch $S_3$. Furthermore, voltages applied to both capacitors $C_1$ and $C_2$ are equalized (their average is determined) and are each set to $(V_1+V_2)/2$.

Figure 6:
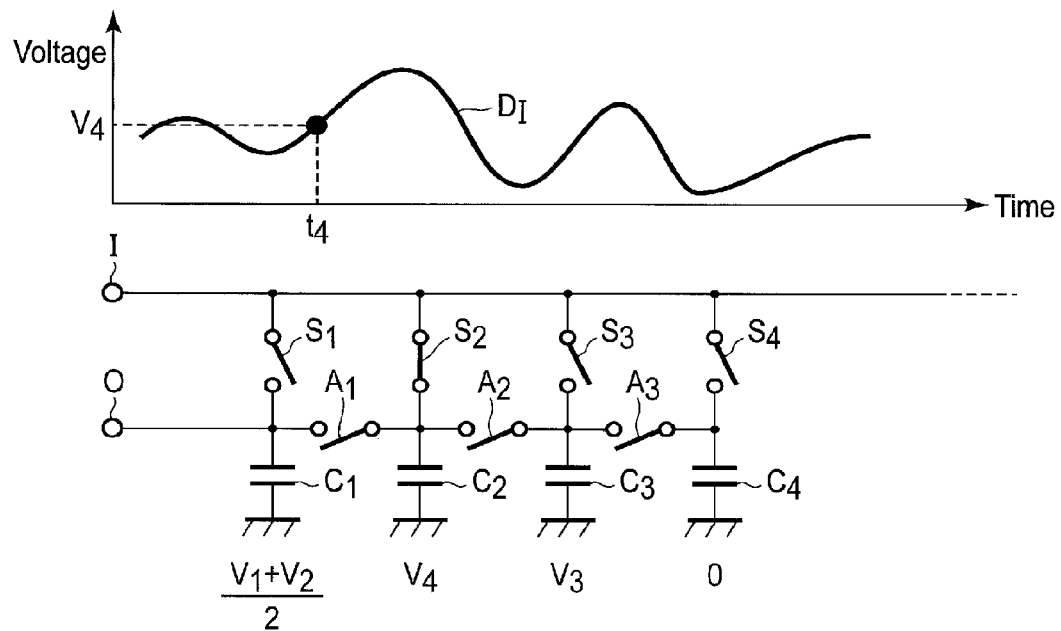
FIG. 6 is a circuit diagram showing an example of the fifth stage of the operation performed by the averaging circuit according to the first embodiment.

FIG. 6 is a circuit diagram showing an example of the fifth stage of the operation performed by the averaging circuit 1 according to the first embodiment.

At the fifth stage, the controller 3 opens sampling switch $S_3$ and averaging switch $A_1$, and resets the voltage applied to capacitor $C_2$ (sets the voltage to zero). Then, the controller 3 closes sampling switch $S_2$. Thereby, voltage $V_4$ of input signal $D_I$ at time $t_4$ is applied to capacitor $C_2$ connected in series to sampling switch $S_2$.

Figure 7:
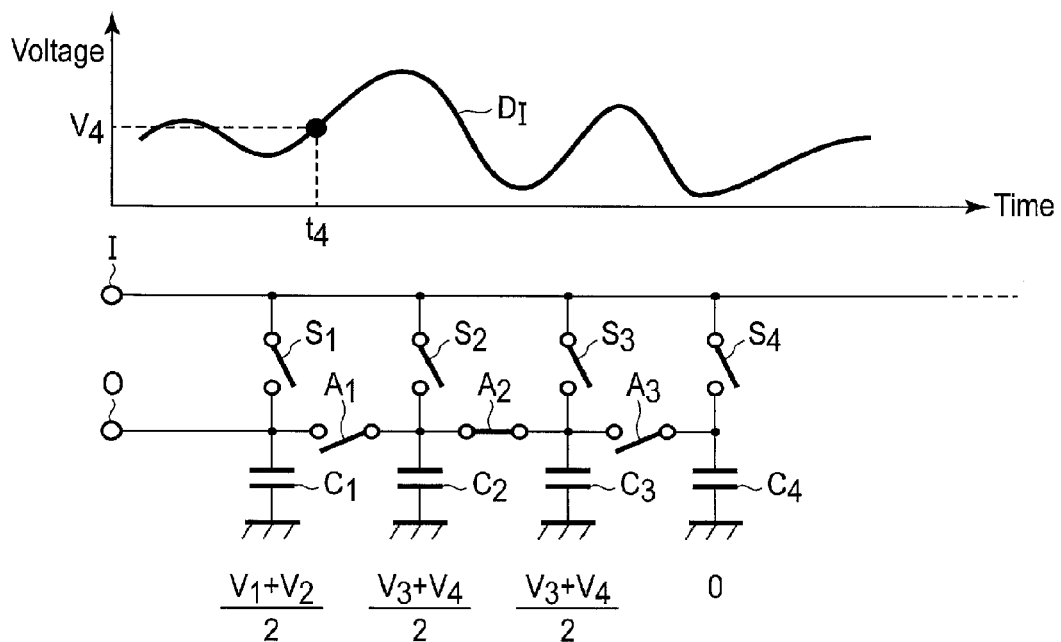
FIG. 7 is a circuit diagram showing an example of the sixth stage of the operation performed by the averaging circuit according to the first embodiment.

FIG. 7 is a circuit diagram showing an example of the sixth stage of the operation performed by the averaging circuit 1 according to the first embodiment.

At the sixth stage, the controller 3 opens sampling switch $S_2$, and then closes averaging switch $A_2$. Thereby, voltages applied to both capacitors $C_2$ and $C_3$ are equalized (their average is determined) and are each set to $(V_3+V_4)/2$.

FIG. 8 is a circuit diagram showing an example of the seventh stage of the operation performed by the averaging circuit 1 according to the first embodiment.

At the seventh stage, the controller 3 opens averaging switch $A_2$, and then closes averaging switch $A_1$. Thereby, voltages applied to both capacitors $C_1$ and $C_2$ are equalized (averaged out) and are each set to $(V_1+V_2+V_3+V_4)/2$.

FIG. 9 is a circuit diagram illustrating by way of example the eighth stage of the operation of the averaging circuit 1 according to the first embodiment.

At the eighth stage, the controller 3 opens averaging switch $A_1$, and then resets the voltages applied to capacitors $C_2$ and $C_3$ (sets the voltages to zero).

Figure 10:
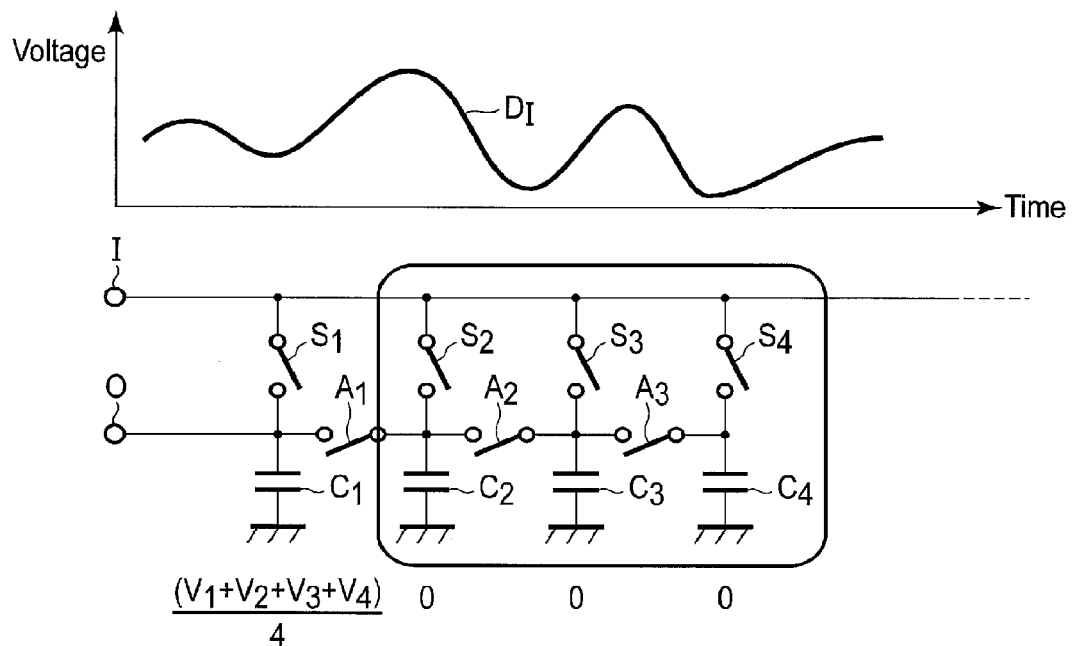
FIG. 10 is a circuit diagram showing an example of the ninth stage of the operation performed by the averaging circuit according to the first embodiment.

FIG. 10 is a circuit diagram showing an example of the ninth stage of the operation performed by the averaging circuit 1 according to the first embodiment.

At the ninth stage, the controller 3 performs the same control over sampling switches $S_2$ to $S_4$ and averaging switches $A_2$ and $A_3$ as over sampling switches $S_1$ to $S_3$ and averaging switches $A_1$ and $A_2$ at the first to eighth stages as illustrated in FIGS. 2 to 9.

Figure 11:
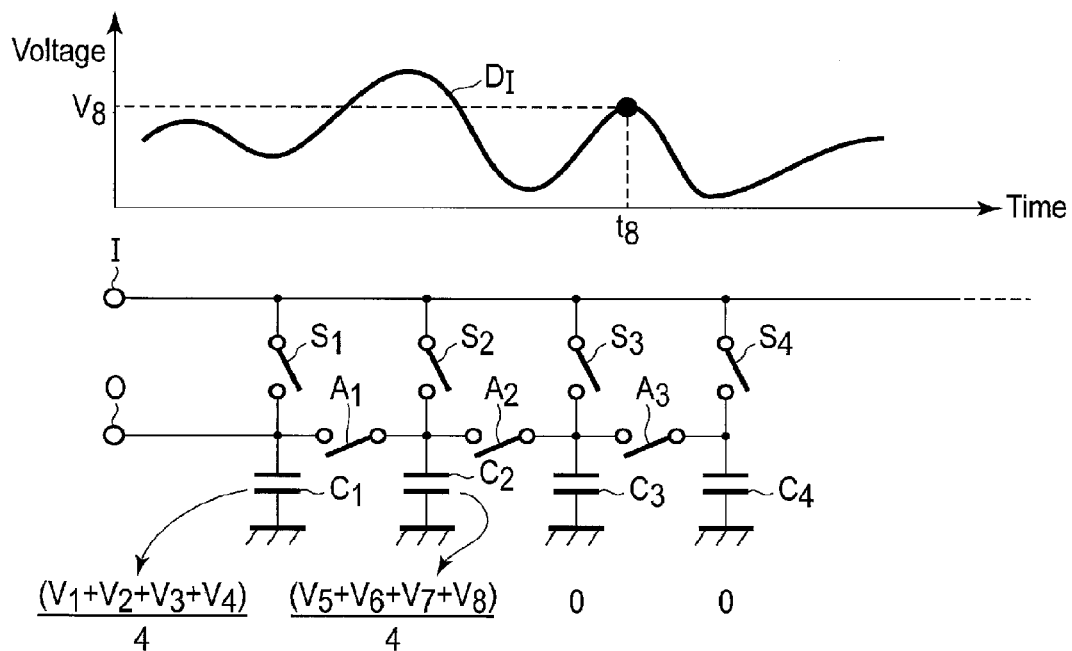
FIG. 11 is a circuit diagram showing an example of the tenth stage of the operation performed by the averaging circuit according to the first embodiment.

FIG. 11 is a circuit diagram showing an example of the tenth stage of the operation performed by the averaging circuit 1 according to the first embodiment.

At the tenth stage, the voltage applied to capacitor $C_1$ is varied to $(V_1+V_2+V_3+V_4)/4$, and the voltage applied to capacitor $C_2$ is varied to $(V_5+V_6+V_7+V_8)/4$. It should be noted that voltages $V_5$ to $V_8$ are voltages of input signal $D_I$ at time $t_5$ to $t_8$, respectively. The voltages applied to capacitors $C_3$ and $C_4$ are changed to zero.

Figure 12:
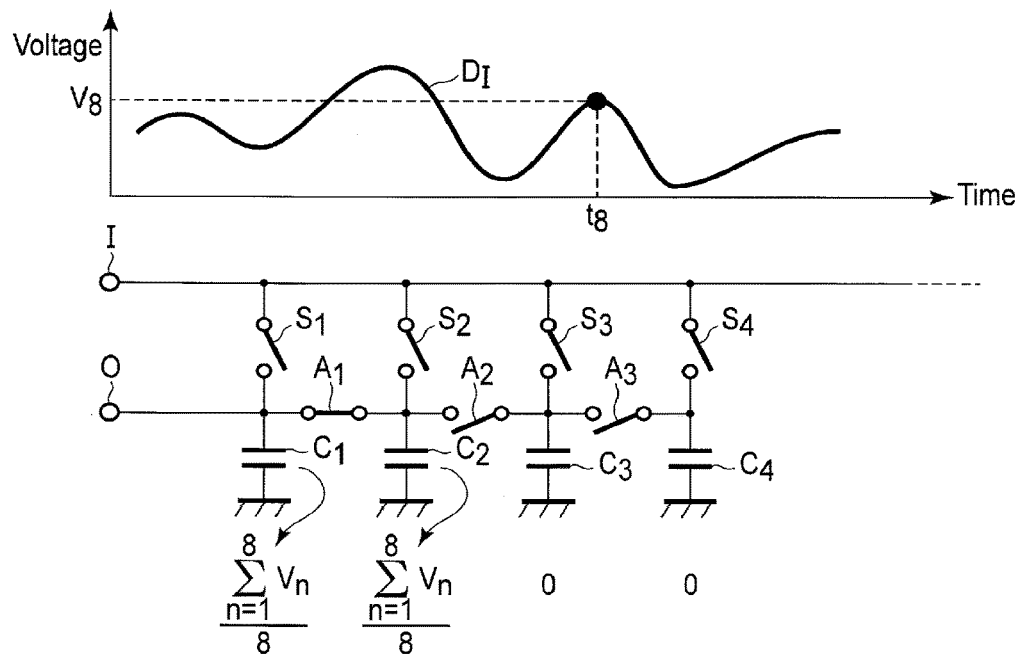
FIG. 12 is a circuit diagram showing an example of the eleventh stage of the operation performed by the averaging circuit according to the first embodiment.

FIG. 12 is a circuit diagram showing an example of the eleventh stage of the operation performed by the averaging circuit 1 according to the first embodiment.

At the eleventh stage, the controller 3 closes averaging switch $A_1$. Thereby, voltages applied to both capacitors $C_1$ and $C_2$ are equalized and are each set to $(V_1+V_2+V_3+V_4+V_5+V_6+V_7+V_8)/8$.

The controller 3 causes charge accumulated in either capacitor $C_1$ or $C_2$ to be output from output terminal O. As a result, a voltage having the average value of the voltages of input signal $D_I$ at time $t_1$ to $t_8$ can be output.

It should be noted that the above second and third stages may be applied in reverse order. That is, it may be set that at the second stage, the controller 3 closes sampling switch $S_1$ to apply voltage $V_1$ to capacitor $C_1$, and at the third stage, the controller 3 closes sampling switch $S_2$ to apply voltage $V_2$ to capacitor $C_2$. In this case, at the fourth stage, the controller 3 opens sampling switch $S_2$, and then closes sampling switch $S_3$ and averaging switch $A_1$.

Furthermore, it may be set that in the above fourth and fifth stages, the controller 3 determines the average of the voltages applied to both capacitors $C_1$ and $C_2$, and resets the voltage applied to capacitor $C_2$ (sets it to zero); and then causes voltage $V_3$ to be applied to capacitor $C_3$ by closing sampling switch $S_3$, and voltage $V_4$ to be applied to capacitor $C_2$ by closing sampling switch $S_2$. In this case, sampling switch $S_3$ and sampling switch $S_2$ may be operated in reverse order. That is, it may be set that sampling switch $S_2$ is closed to apply voltage $V_3$ to capacitor $C_2$, and sampling switch $S_3$ is closed to apply voltage $V_4$ to capacitor $C_3$.

Furthermore, the above operation of resetting the voltage applied to capacitor $C_3$ (setting it to zero) at the eighth stage may be performed at any time before the seventh stage is started after determining the average of the voltages applied to both capacitors $C_2$ and $C_3$ at the sixth stage.

The advantage of the averaging circuit 1 according to the first embodiment, which has the structure as described above, will be explained.

Figure 13:
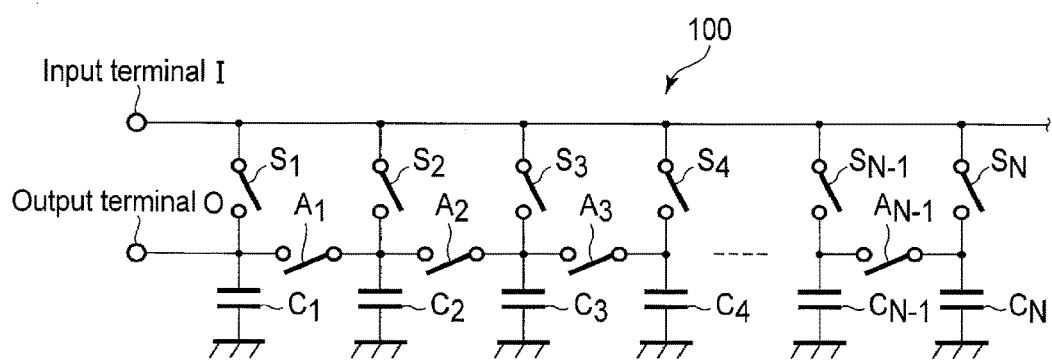
FIG. 13 is a circuit diagram showing an example of a general averaging circuit as a comparative example.

FIG. 13 is a circuit diagram showing an example of a general averaging circuit, which will be described as a comparative example. The averaging circuit 100 determines the average value of N signal values. In this case, the averaging circuit 100 includes N sampling switches $S_1$ to $S_N$, N capacitors $C_1$ to $C_N$ and N−1 averaging switches $A_1$ to $A_{N-1}$.

One end of sampling switch $S_1$ is connected to input terminal I, and the other end of sampling switch $S_1$ is connected to one end of capacitor $C_1$. The other end of capacitor $C_1$ is grounded.

The same is true of sampling switches $S_2$ to $S_N$ and capacitors $C_2$ to $C_N$; that is, sampling switches $S_2$ to $S_N$ and capacitors $C_2$ to $C_N$ are set in the same manner as sampling switch $S_1$ and capacitor $C_1$.

Ends of averaging switches $A_1$ to $A_{N-1}$ are respectively connected to ends of sampling switches $S_1$ to $S_{N-1}$ and ends of capacitors $C_1$ to $C_{N-1}$. The other ends of averaging switches $A_1$ to $A_{N-1}$ are respectively connected to the above ends of sampling switches $S_2$ to $S_N$ and the above ends of capacitors $C_2$ to $C_N$.

The capacitances of capacitors $C_1$ to $C_N$ are equal to each other.

Output terminal O is connected to any of averaging switches $A_1$ to $A_{N-1}$.

First, the averaging circuit 100 opens sampling switches $S_1$ to $S_N$, and also opens averaging switches $A_1$ to $A_{N-1}$.

Next, the averaging circuit 100 closes only sampling switch $S_1$ to accumulate in capacitor $C_1$, charge input from input terminal I.

Subsequently, the averaging circuit 100 opens sampling switch $S_1$ and closes sampling switch $S_2$ to accumulate in capacitor $C_2$, charge input from input terminal I.

Thereafter, in the same manner as described above, charge input from input terminal I is accumulated in capacitors $C_3$ to $C_N$ successively.

Then, the averaging circuit 100 open sampling switches $S_1$ to $S_N$ and close averaging switches $A_1$ to $A_{N-1}$ to equalize the voltages applied to capacitors $C_1$ to $C_N$, (determine the average of the voltages) i.e., equalize charge accumulated in capacitors $C_1$ to $C_N$. The averaging circuit 100 outputs the equalized charge from any of capacitors $C_1$ to $C_N$ through output terminal O.

In the averaging circuit 100, the greater the number N of signal values to be equalized (signal values the average of which is to be determined), the greater the number of sampling switches $S_1$ to $S_N$, that of capacitors $C_1$ to $C_N$ and that of averaging switches $A_1$ to $A_{N-1}$. Therefore, the greater the number N of signal values to be equalized, the greater the area of the averaging circuit 100.

FIG. 14 is a graph showing an example of a relationship between noise power and the number N of signal values to be equalized in the averaging circuit 1 according to the first embodiment.

In both a theoretical value and the result of a simulation such as one done with Simulation Program with Integrated Circuit Emphasis (SPICE), the greater the number N of signal values to be equalized, the lower the noise power. To be more specific, N signal values are equalized (the average of these signal values is determined), so that noise power can be reduced to 1/N.

FIG. 15 is a graph showing an example of a reduction result of a circuit area, i.e., the area of the averaging circuit 1 according to the first embodiment.

In an ordinary averaging circuit 100, the greater the number N of signal values to be equalized, the greater the number of capacitors included in the averaging circuit 100. Inevitably, the circuit area is increased in proportion to the increase in the number of capacitors. By contrast, in the averaging circuit 1 according to the first embodiment, the number M (M is a natural number of 2 or more) of capacitors can be reduced to $(\log_2 N)+1$. That is, in the first embodiment, even if the number N of signal values is increased, it is restricted that the circuit area is increased.

The averaging circuit 1 according to the first embodiment is used to reduce noise in, for example, a wireless receiver. With respect to the averaging circuit 1, the average of N signal values can be determined in a circuit area which varies in proportion to $(\log_2 N)+1$, and is smaller than a circuit area varying in proportion to N. For example, where N=128, the area of the averaging circuit 1 can be reduced by approximately 94% of the area of the ordinary averaging circuit.

It should be noted that the above explanation of the first embodiment is given with respect to the case where the average of signal values is determined under a condition in which capacitors $C_1$ to $C_M$ have the same capacitance. However, if a plurality of capacitors, which are provided such that ends of the capacitors are connected to input terminal I, with switches interposed between the ends of the capacitors and the input terminal, and the other ends of the capacitors are grounded, have different capacitances which depend on the values of weighting coefficients, respectively, they can be applied to another kind of circuit such as a finite impulse response (FIR) filter.

Second Embodiment

The second embodiment will be explained by referring to the averaging circuit according to the first embodiment in detail. In the following, the explanations given above with reference to FIGS. 1 to 15 are not repeated.

FIG. 16 is a circuit diagram showing an example of a schematic configuration of an averaging circuit 1 according to the second embodiment.

FIG. 17 is a circuit diagram showing an example of a detailed configuration of the averaging circuit 1 according to the second embodiment.

The averaging circuit 1 includes M sampling switches $S_1$ to $S_M$ and M capacitors $C_1$ to $C_M$, M−1 averaging switches $A_1$ to $A_{M-1}$, M reset switches $R_1$ to $R_M$, reset switches $R_1$ to $R_M$, output switch $S_{OUT}$ and output capacitor $C_{OUT}$.

Ends of reset switches $R_1$ to $R_M$ are connected to ends of capacitors $C_1$ to $C_M$, respectively. The other ends of reset switches $R_1$ to $R_M$ are grounded.

When reset switches $R_1$ to $R_M$ are closed (turned on), charge accumulated in capacitors $C_1$ to $C_M$ is reset so that the capacitances of capacitors $C_1$ to $C_M$ are set to zero. The controller 3, as described later, produces control signals for effecting switching between ON and OFF states (closing and opening) of each of sampling switches $S_1$ to $S_4$ and switching between ON and OFF states (closing and opening) of each of averaging switches $A_1$ to $A_3$.

An end of output switch $S_{OUT}$ is connected to an end of sampling switch $S_1$ and an end of capacitor $C_1$. The other end of output switch $S_{OUT}$ is connected to an end of output capacitor $C_{OUT}$ and output terminal O. The other end of output capacitor $C_{OUT}$ is grounded.

When output switch $S_{OUT}$ is closed, output signal $D_0$ is output from output terminal O.

The controller 3, as described later, produces control signals for effecting switching between ON and OFF states (closing and opening) of each of sampling switches $S_1$ to $S_M$, each of averaging switches $A_1$ to $A_{M-1}$, each of reset switches $R_1$ to $R_M$, and output switch $S_{OUT}$.

Figure 18:
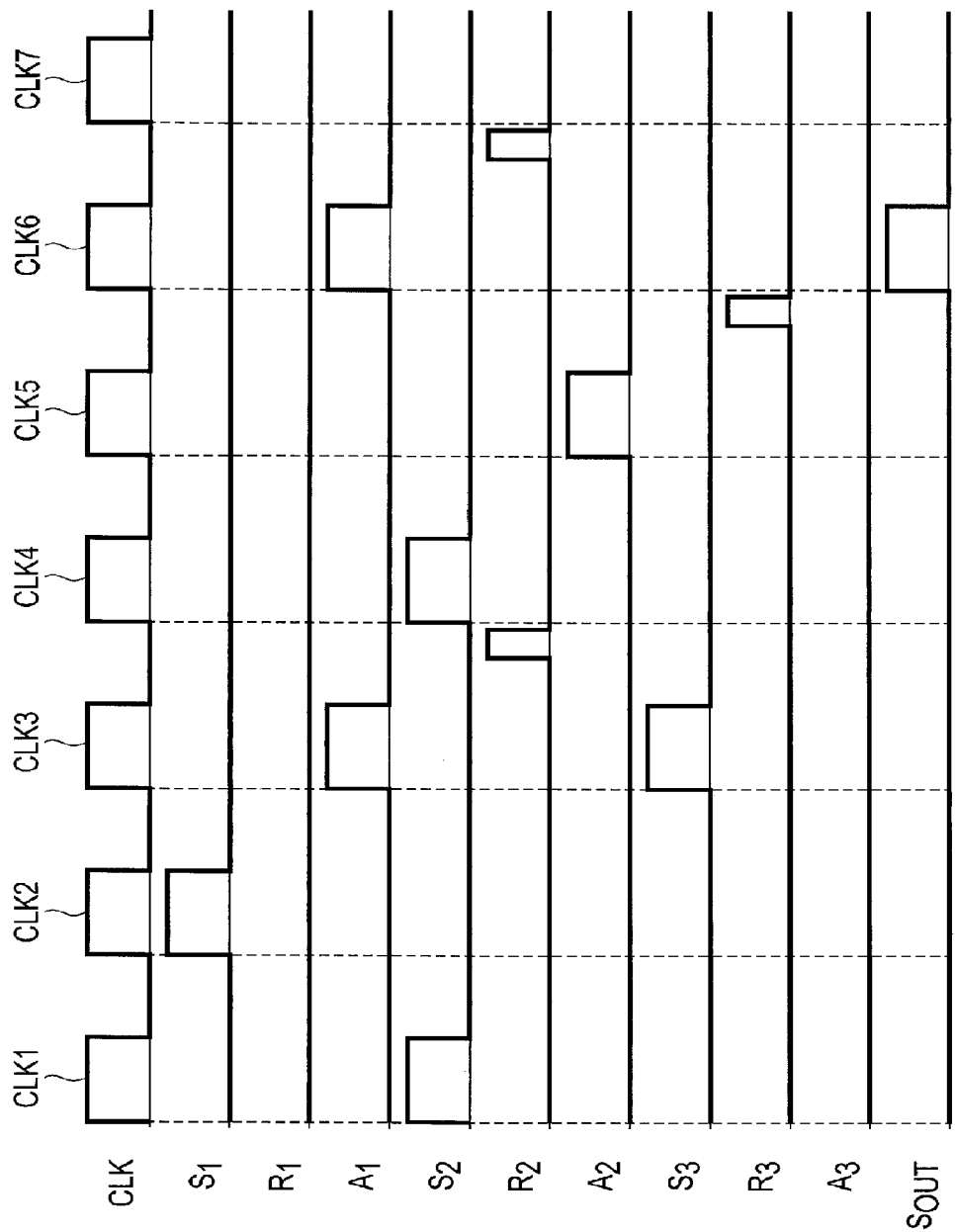
FIG. 18 is a timing chart showing an example of an operation of the averaging circuit, according to the second embodiment.

FIG. 18 is a timing chart illustrating an example of the operation of the averaging circuit 1 according to the second embodiment. FIG. 18 illustrates by way of example the case where sampling switches $S_1$ to $S_3$, averaging switches $A_1$ and $A_2$ and reset switches $R_1$ to $R_3$ are opened and closed, so that an average value of N (N=4) signal values is determined.

It should be noted that where N=8, an average value (first average value) of four signals is determined by opening and closing sampling switches $S_1$ to $S_3$, averaging switches $A_1$ to $A_3$ and reset switches $R_1$ and $R_2$, and an average value (second average value) of other four signals is determined by opening and closing sampling switches $S_2$ to $S_4$, averaging switches $A_2$ to $A_4$ and reset switches $R_2$ and $R_3$; and an average value of the first average value and the second average value is further determined.

Also, where N=12 or more, 12 or more signals are divided into three or more groups, an average value of four signal values belonging to each of the three or more groups is determined, that is, average values of the three or more groups are successively determined; and an average value of the determined average values of the three or more groups is then determined.

The controller 3 operates in response to a clock signal CLK. The clock signal CLK repeatedly changes between high and low. This will be explained in detail as follows:

When first clock signal CLK1 is high, the controller 3 closes (turns on) sampling switch $S_2$. Thereby, voltage $V_1$ is applied to capacitor $C_2$.

When second clock signal CLK2 is high, the controller 3 closes sampling switch $S_1$. Thereby, voltage $V_2$ is applied to capacitor $C_1$.

When third clock signal CLK3 is high, the controller 3 closes averaging switch $A_1$ and sampling switch $S_3$. Thereby, voltage $(V_1+V_2)/2$ is applied to capacitors $C_1$ and $C_2$, and voltage $V_3$ is applied to capacitor $C_3$.

In a period between a period which third clock signal CLK3 is high and a period in which fourth clock signal CLK4 is high (when third clock signal CLK3 becomes low), the controller 3 closes reset switch $R_2$. Thereby, the voltage of capacitor $C_2$ is reset.

When fourth clock signal CLK4 is high, the controller 3 closes sampling switch $S_2$. Thereby, voltage $V_4$ is applied to capacitor $C_2$.

When fifth clock signal CLK5 is high, the controller 3 closes averaging switch $A_2$. Thereby, voltage $(V_3+V_4)/2$ is applied to capacitors $C_2$ and $C_3$.

In a period between a period in which fifth clock signal CLK5 is high and a period in which sixth clock signal CLK6 is high (when fifth clock signal CLK5 becomes low), the controller 3 closes reset switch $R_3$. Thereby, the voltage of capacitor $C_3$ is reset.

When sixth clock signal CLK6 is high, the controller 3 closes averaging switch $A_1$ and output switch $S_{OUT}$. Thereby, voltage $(V_1+V_2+V_3+V_4)/4$ is applied to capacitors $C_2$ and $C_3$, and an output signal corresponding to voltage $(V_1+V_2+V_3+V_4)/4$ is output from output terminal O.

In a period between a period in which sixth clock signal CLK6 is high and a period in which seventh clock signal CLK7 is high (when sixth clock signal CLK6 becomes low), the controller 3 closes reset switch $R_2$. Thereby, the voltage of capacitor $C_2$ is reset.

An algorithm which is applied in the controller 3 according to the second embodiment will be explained.

k is a natural number which satisfies the formula $0<k\le N$.

In the case where $k=a_0 \cdot 2^0 + a_1 \cdot 2^1 + \ldots + a_P \cdot 2^P$ (P is a natural number), X(k) is expressed by formula (1) below.

$$X(k)=\Sigma_{q=0}^{P} a_q \qquad (1)$$

For example, where k=5, if 5 is expressed in a binary number, it is 101. In this case, X(5) is 2.

First, sampling of voltage $V_k$ will be explained. It should be noted that in the second embodiment, it will be referred to as sampling that a voltage corresponding to an input signal is applied to a capacitor.

Where k is an odd number, the controller 3 closes X(k)+$1^{th}$ sampling switch $S_{X(k)+1}$ to apply voltage $V_k$ to X(k)+$1^{th}$ capacitor $C_{X(k)+1}$.

Where k is an even number, the controller 3 closes X(k−1)$^{th}$ sampling switch $S_{X(k−1)}$ to apply voltage $V_k$ to X(k−1)$^{th}$ capacitor $C_{X(k−1)}$.

Then, equalization will be explained.

The controller 3 performs first to third controls, which will be explained below, over averaging switches $A_1$ to $A_{M-1}$.

In the first control, in the case where k is a multiple of 2, after completion of $k^{th}$ sampling and before completion of k+$1^{th}$ sampling, the controller 3 closes X(k−1)$^{th}$ averaging switch $A_{X(k−1)}$ to equalize voltages applied to X(k−1)$^{th}$ capacitor $C_{X(k−1)}$ and X(k−1)+$1^{th}$ capacitor $C_{X(k−1)+1}$.

In the second control, in the case where k is a multiple of 4, before completion of k+$1^{th}$ sampling, the controller 3 closes X(k−1)−$1^{th}$ averaging switch $A_{X(k−1)−1}$, and equalizes voltages applied to X(k−1)−$1^{th}$ capacitor $C_{X(k−1)−1}$ and X(k−1)$^{th}$ capacitor $C_{X(k−1)}$. The second control over an averaging switch is performed after the first control over the averaging switch.

In the third control, in the case where k is a multiple of an exponent of 2 ($2^P$), before completion of sampling of k+$1^{th}$ sampling, the controller 3 closes X(k−1)+1−$P^{th}$ averaging switch $A_{X(k−1)+1−P}$, and equalizes voltages applied to X(k−1)+1−$P^{th}$ capacitor $C_{X(k−1)+1−P}$ and X(k−1)+2−$P^{th}$ capacitor $C_{X(k−1)+2−P}$. The third control over an averaging switch is performed after the second control over the averaging switch. It should be noted that the above operation is performed on all values of P in the ascending order of the value of P.

For example, if an averaging switch satisfies execution conditions for execution of a plurality of controls which are included in the above first to third controls (for example, an execution condition in which k is 2 or 4), and the plurality of controls have the same processing content, only one of the controls is performed.

As described above, if an averaging switch satisfies execution conditions for execution of a plurality of controls which are included in the above first to third controls (for example, an execution condition in which k is 8 or 16), and the plurality of controls have different processing content, the third control is performed after the first and second controls.

Next, it will be explained how a capacitor is reset.

After the controller 3 closes X(k−1)$^{th}$ averaging switch $A_{X(k−1)}$, before starting k+$1^{th}$ sampling, the controller 3 closes X(k−1)+$1^{th}$ reset switch $R_{X(K−1)+1}$ to discharge capacitor $C_{X(k−1)+1}$.

After the above operation is completed, the controller 3 increments the value of k by 1, and also performs sampling of voltage $V_{k+1}$. When k becomes greater than N, the sampling is ended.

To be more specific, for example, if k is 16, it is a multiple of 2, and the execution condition for the above first control is thus satisfied. Also, since k is a multiple of 4, the execution condition for the second control is satisfied. In addition, since k is a multiple of $2^3$ and $2^4$, and P=3 and 4, the execution condition for the third control is satisfied. Therefore, the first to third controls are successively performed in the following manner.

First, in the first control, averaging switch $A_4$ is closed to equalize the voltages applied to capacitors $C_4$ and $C_5$.

Next, in the second control, averaging switch $A_3$ is closed to equalize the voltages applied to capacitors $C_3$ and $C_4$.

Furthermore, in the third control, as a control to be performed in the case where P=3, averaging switch $A_2$ is closed to equalize the voltages applied to capacitors $C_2$ and $C_3$. Subsequently, as a control to be performed in the case where P=4, averaging switch $A_1$ is closed to equalize the voltages applied to capacitor $C_1$ and $C_2$.

After the operations of the above first to third controls, the controller 3 increments the value of k by 1, and performs sampling of voltage $V_{17}$.

As described above, in the averaging circuit 1 according to the second embodiment, the circuit area can be effectively reduced as explained with respect to the first embodiment.

Third Embodiment

The third embodiment will be explained by referring to a modification of the averaging circuit according to each of the first and second embodiments. In the following, the explanations given above with reference to FIGS. 1 to 18 are not repeated.

FIG. 19 is a circuit diagram showing an example of a schematic configuration of an averaging circuit 1A according to the third embodiment.

Figure 20:
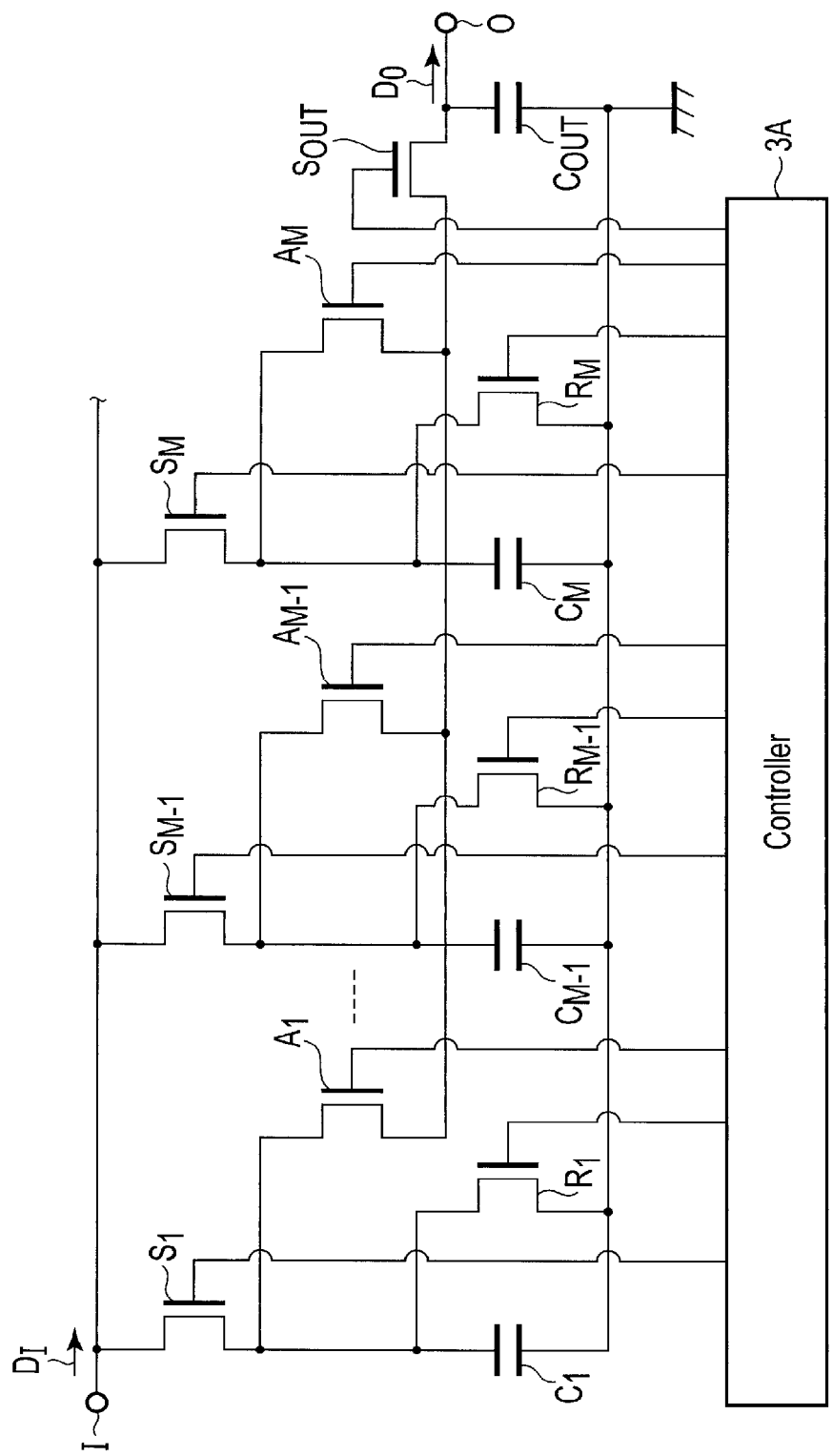
FIG. 20 is a circuit diagram showing an example of a detailed configuration of the averaging circuit according to the third embodiment.

FIG. 20 is a circuit diagram showing an example of a detailed configuration of the averaging circuit 1A according to the third embodiment.

The averaging circuit 1A includes M sampling switches $S_1$ to $S_M$ and M capacitors $C_1$ to $C_M$, M averaging switches $A_1$ to $A_M$, M reset switches $R_1$ to $R_M$, output switch $S_{OUT}$ and output capacitor $C_{OUT}$.

In the third embodiment, sampling switches $S_1$ to $S_M$, capacitors $C_1$ to $C_M$ and reset switches $R_1$ to $R_M$ are formed to have the same structures as those in the first embodiment and the second embodiment.

In the third embodiment, ends of averaging switches $A_1$ to $A_M$ are connected to ends of capacitors $C_1$ to $C_M$, respectively. The other ends of averaging switches $A_1$ to $A_M$ are connected to one end of output switch $S_{OUT}$. The other end of output switch $S_{OUT}$ is connected to one end of output capacitor $C_{OUT}$ and output terminal O. The other end of output capacitor $C_{OUT}$ is grounded.

When output switch $S_{OUT}$ is closed, output signal $D_0$ is output from output terminal O.

FIG. 21 is a timing chart showing an example of an operation of the averaging circuit 1A according to the third embodiment. To be more specific, FIG. 21 shows by way of example the case where sampling switches $S_1$ to $S_3$, averaging switches $A_1$ to $A_3$ and reset switches $R_1$ to $R_3$ are opened and closed, so that an average value of N signals (N=4) is determined.

It should be noted that where N=8, an average value (first average value) of four signals is determined by opening and closing sampling switches $S_1$ to $S_3$, averaging switches $A_1$ to $A_3$ and reset switches $R_1$ to $R_3$, and an average value (second average value) of other four signals is determined by opening and closing sampling switches $S_2$ to $S_4$, averaging switches $A_2$ to $A_4$ and reset switches $R_2$ to $R_4$; and an average value of the first average value and the second average value is further determined.

Also, where N=12 or more, 12 or more signals are divided into three or more groups, an average value of four signal values belonging to each of the three or more groups is determined, that is, average values of the three or more groups are successively determined; and an average value of the determined average values of the three or more groups is then determined.

The controller 3A operates in response to a clock signal CLK. The clock signal CLK repeatedly changes between high and low. This will be explained in detail as follows:

When first clock signal CLK1 is high, the controller 3A closes sampling switch $S_2$. Thereby, voltage $V_1$ is applied to capacitor $C_2$.

When second clock signal CLK2 is high, the controller 3A closes sampling switch $S_1$. Thereby, voltage $V_2$ is applied to capacitor $C_1$.

When third clock signal CLK3 is high, the controller 3A closes averaging switches $A_1$ and $A_2$ and sampling switch $S_3$. Thereby, voltage $(V_1+V_2)/2$ is applied to capacitors $C_1$ and $C_2$, and voltage $V_3$ is applied to capacitor $C_3$.

In a period between a period which third clock signal CLK3 is high and a period in which fourth clock signal CLK4 is high (when third clock signal CLK3 becomes low), the controller 3A closes reset switch $R_2$. Thereby, the voltage of capacitor $C_2$ is reset.

When fourth clock signal CLK4 is high, the controller 3A closes sampling switch $S_2$. Thereby, voltage $V_4$ is applied to capacitor $C_2$.

When fifth clock signal CLK5 is high, the controller 3A closes averaging switches $A_2$ and $A_3$. Thereby, voltage $(V_3+V_4)/2$ is applied to capacitors $C_2$ and $C_3$.

In a period between a period which fifth clock signal CLK5 is high and a period in which sixth clock signal CLK6 is high (when fifth clock signal CLK5 becomes low), the controller 3A closes reset switch $R_3$. Thereby, the voltage of capacitor $C_3$ is reset.

When sixth clock signal CLK6 is high, the controller 3A closes averaging switches $A_1$ and $A_2$ and output switch $S_{OUT}$. Thereby, voltage $(V_1+V_2+V_3+V_4)/4$ is applied to capacitors $C_2$ and $C_3$, and an output signal corresponding to voltage $(V_1+V_2+V_3+V_4)/4$ is output from output terminal O.

In a period between a period which sixth clock signal CLK6 is high and a period in which seventh clock signal CLK7 is high (when sixth clock signal CLK6 becomes low), the controller 3A closes reset switch $R_2$. Thereby, the voltage of capacitor $C_2$ is reset.

An algorithm which is applied in the controller 3A according to the third embodiment will be explained.

k, P and X(k) are the same as those in the second embodiment.

Sampling of voltage $V_k$ is also the same as in the second embodiment.

Next, equalization will be explained.

The controller 3A performs first to third controls, which will be explained below, over averaging switches $A_1$ to $A_M$.

In the first control, in the case where k is a multiple of 2, after completion of $k^{th}$ sampling and before completion of $k+1^{th}$ sampling, the controller 3A closes $X(k-1)^{th}$ averaging switch $A_{X(k-1)}$ and $X(k-1)+1^{th}$ averaging switch $A_{X(k-1)+1}$ to equalize the voltages applied to $X(k-1)^{th}$ capacitor $C_{X(k-1)}$ and $X(k-1)+1^{th}$ capacitor $C_{X(k-1)+1}$.

In the second control, in the case where k is a multiple of 4, before completion of $k+1^{th}$ sampling, the controller 3A closes $X(k-1)-1^{th}$ averaging switch $A_{X(k-1)-1}$ and $X(k-1)^{th}$ averaging switch $A_{X(k-1)}$ to equalize the voltages applied to $X(k-1)-1^{th}$ capacitor $C_{X(k-1)-1}$ and $X(k-1)^{th}$ capacitor $C_{X(k-1)}$. The second control over an averaging switch is performed after the first control over the averaging switch.

In the third control, in the case where k is a multiple of an exponent of 2 ($2^P$), before completion of sampling of $k+1^{th}$ sampling, the controller 3A closes $X(k-1)+1-P^{th}$ averaging switch $A_{X(k-1)+1-P}$ and $X(k-1)+2-P^{th}$ averaging switch $A_{X(k-1)+2-P}$ to equalize voltages applied to $X(k-1)+1-P^{th}$ capacitor $C_{X(k-1)+1-P}$ and $X(k-1)+2-P^{th}$ capacitor $C_{X(k-1)+2-P}$. The third control over an averaging switch is performed after the second control over the averaging switch. It should be noted that the above operation is performed on all values of P in the ascending order of the value of P.

It should be noted that in the third embodiment, if an averaging switch satisfies execution conditions for execution of a plurality of controls which are included in the above first to third controls, and the plurality of controls have the same processing content, only one of the controls is performed as in the second embodiment.

Next, it will be explained how a capacitor is reset.

After the controller 3A closes $X(k-1)^{th}$ averaging switch $A_{X(k-1)}$, before starting $k+1^{th}$ sampling, the controller 3A closes $X(k-1)+1^{th}$ reset switch $R_{X(K-1)+1}$ to discharge capacitor $C_{X(k-1)+1}$.

After completion of the above operation, the controller 3A increments the value of k by 1, and also performs sampling of voltage $V_{k+1}$. When k becomes greater than N, the sampling is ended.

In the averaging circuit 1A as explained above, the circuit area can be effectively reduced as in the first and second embodiments.

Furthermore, in the third embodiment, M averaging switches $A_1$ to $A_M$ are assigned to M capacitors $C_1$ to $C_M$, respectively. Thereby, a single set of switches, i.e., a reset switch, a sampling switch and an averaging switch, are assigned to a single capacitor, thus clarifying the relationship between circuit elements.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An averaging circuit comprising a capacitor circuit and a controller which controls the capacitor circuit,
    wherein the capacitor circuit comprises:
    a plurality of circuit units including capacitors and sampling switches, the capacitor and sampling switch included in each of the circuit units being connected in series to each other; and
    a plurality of averaging switches which switch two capacitors connected in series among the capacitors included in the circuit units,
    the capacitors comprise first to third capacitors,
    the sampling switches comprise first to third sampling switches,
    the averaging switches comprise first and second averaging switches,
    a first end of the first sampling switch is connected to an input terminal, a second end of the first sampling switch is connected to a first end of the first capacitor, a second end of the first capacitor is grounded,
    a first end of the second sampling switch is connected to the input terminal, a second end of the second sampling switch is connected to a first end of the second capacitor, a second end of the second capacitor is grounded, a first end of the third sampling switch is connected to the input terminal, a second end of the third sampling switch is connected to a first end of the third capacitor, a second end of the third capacitor is grounded, a first end of the first averaging switch is connected to the second end of the first sampling switch and the first end of the first capacitor, a second end of the first averaging switch is connected to the second end of the second sampling switch and the first end of the second capacitor, a first end of the second averaging switch is connected to the second end of the second sampling switch and the first end of the second capacitor, a second end of the second averaging switch is connected to the second end of the third averaging switch and the first end of the third capacitor, the first end of the first capacitor is connected to an output terminal, and the controller, by controlling the sampling switches included in the circuit units and the averaging switches, performs an operation to:

cause a first first-stage average voltage to be applied to the first capacitor included in the circuit units, the first first-stage average voltage being an average of a first sample voltage applied to the first capacitor and a second sample voltage applied to the second capacitor included in the circuit units, in a first process;

cause a second first-stage average voltage to be applied to the second capacitor, the second first-stage average voltage being an average of a third sample voltage applied to the second capacitor and a fourth sample voltage applied to the third capacitor included in the circuit units, in a second process; and cause a first second-stage average voltage to be applied to the first capacitor, the first second-stage average voltage being an average of the first and second first-stage average voltages applied to the first and second capacitors, in a third process.

2. The averaging circuit of claim 1, wherein
the capacitors further comprise a fourth capacitor,
the sampling switches further comprise a fourth sampling switch,
the averaging switches further comprise a third averaging switch,
a first end of the fourth sampling switch is connected to the input terminal, a second end of the fourth sampling switch is connected to a first end of the fourth capacitor, a second end of the fourth capacitor is grounded, a first end of the third averaging switch is connected to the second end of the third sampling switch and the first end of the third capacitor, a second end of the third averaging switch is connected to the second end of the fourth sampling switch and the first end of the fourth capacitor, and the controller further performs an operation to:

cause a third first-stage average voltage to be applied to the second capacitor, the third first-stage average voltage being an average of a fifth sample voltage applied to the second capacitor and a sixth sample voltage applied to the third capacitor, in a fourth process;

cause a fourth first-stage average voltage to be applied to the third capacitor, the fourth first-stage average voltage being an average of a seventh sample voltage applied to the third capacitor and an eighth sample voltage applied to a fourth capacitor included in the circuit units, in a fifth process;

cause a second second-stage average voltage to be applied to the second capacitor, the second second-stage average voltage being an average of the third and fourth first-stage average voltages applied to the second and third capacitors, in a sixth process; and cause a third-stage average voltage to be applied to the first capacitor, the third-stage average voltage being an average of the first second-stage average voltage applied to the first capacitor and the second second-stage average voltage applied to the second capacitor, in a seventh process.

3. The averaging circuit of claim 1, wherein:
where N is a natural number of $A \times 2^P$, A is any of 1, 2 and 3, P is a natural number, and M is $(\log_2 N)+1$, the capacitor circuit comprises the first to $M^{th}$ capacitors;

the controller controls voltage applying and resetting to the first to $M^{th}$ capacitors, and controls averaging of voltages applied to two of the first to $M^{th}$ capacitors; and the controller causes the first to $N^{th}$ sample voltages to be selectively applied to the first to $M^{th}$ capacitors, determines an average voltage of two sample voltages, repeats to determine an average voltage of two average voltages corresponding to a same sample voltage number, and determines an average value of the first to $N^{th}$ sample voltages.

* * * * *